United States Patent
Yasuda et al.

(10) Patent No.: US 11,050,390 B2
(45) Date of Patent: Jun. 29, 2021

(54) AMPLIFIER CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takaya Yasuda, Kawasaki Kanagawa (JP); Kazuyasu Minami, Yokohama Kanagawa (JP)

(73) Assignees: KABUSHI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/800,762

(22) Filed: Feb. 25, 2020

(65) Prior Publication Data

US 2021/0067102 A1 Mar. 4, 2021

(30) Foreign Application Priority Data

Sep. 3, 2019 (JP) .............................. JP2019-160543

(51) Int. Cl.
*H03F 3/45* (2006.01)
*H03F 1/30* (2006.01)
(Continued)

(52) U.S. Cl.
CPC .............. *H03F 1/308* (2013.01); *H03F 1/52* (2013.01); *H03F 3/26* (2013.01); *H03F 3/3001* (2013.01);
(Continued)

(58) Field of Classification Search
CPC .... H03F 1/308; H03F 3/45179; H03F 3/3001; H03F 3/26; H03F 1/52; H03F 3/3022;
(Continued)

(56) References Cited

U.S. PATENT DOCUMENTS 7,268,621 B2 * 9/2007 Kanoh ...................... H03F 1/52
330/10
7,276,968 B2 * 10/2007 Ozawa .................... H03F 3/217
330/251
(Continued)

FOREIGN PATENT DOCUMENTS

JP          S6030203 A      2/1985
JP          H118520 A       1/1999

*Primary Examiner* — Khanh V Nguyen
(74) *Attorney, Agent, or Firm* — Kim & Stewart LLP

(57) ABSTRACT

An amplifier circuit includes, a first transistor and a first resistor connected in series between a power supply voltage and an output terminal. A second transistor and a second resistor are connected in series between the output terminal and a ground reference voltage. There is a first operational amplifier and a second operational amplifier. A first detection current corresponding to a voltage drop across first resistor is generated. A second detection current corresponding to a voltage drop across the second resistor is generated. A first replication circuit subtracts the second detection current from the first detection current. A third resistor conducts the current obtained by subtracting the second detection current from the first detection current.

20 Claims, 2 Drawing Sheets

(51) Int. Cl.
*H03F 3/26* (2006.01)
*H03F 3/30* (2006.01)
*H03F 1/52* (2006.01)

(52) U.S. Cl.
CPC ....... *H03F 3/45179* (2013.01); *H03F 3/3022* (2013.01)

(58) Field of Classification Search
CPC ............. H03F 3/45183; H03F 3/45192; H03F 3/3088; H03F 1/22; H03F 3/3076; H03F 3/3066; H03F 3/3071; H03F 3/345; H03F 1/307; H03F 1/3217
USPC ................................ 330/255, 261–263, 264
See application file for complete search history.

(56) References Cited

U.S. PATENT DOCUMENTS

| | | |
|---|---|---|
| 9,024,558 B2 | 5/2015 | Sugie |
| 10,432,153 B2 * | 10/2019 | Wang .................... H03F 3/4508 |
| 2004/0184627 A1 * | 9/2004 | Kost ........................ H04L 7/02 381/120 |

* cited by examiner

AMPLIFIER CIRCUIT

CROSS-REFERENCE TO RELATED APPLICATION(S)

This application is based upon and claims the benefit of priority from Japanese Patent Application No. 2019-160543, filed Sep. 3, 2019, the entire contents of which are incorporated herein by reference.

FIELD

Embodiments described herein relate generally to an amplifier circuit.

BACKGROUND

A push-pull amplifier circuit detects an overcurrent of an output load current. By simply detecting a current flowing into one of transistors constituting a push-pull circuit, an error corresponding to a bias current that flows through the push-pull amplifier occurs between the detected current and an actual output current.

DETAILED DESCRIPTION

Embodiments provide an amplifier circuit having a current detection function providing a small error between an output current and a detection current corresponding to the output current.

In general, according to one embodiment, an amplifier circuit includes an output terminal. A first transistor and a first resistor are electrically connected in series between a power supply terminal and the output terminal. A second transistor and a second resistor are electrically connected in series between the output terminal and a ground reference voltage. The second transistor and the first transistor are different channel types. A first operational amplifier has a positive input terminal electrically connected to a first end of the first resistor and a negative input terminal electrically connected to a second end of the first resistor. A second operational amplifier has a positive input terminal electrically connected to a first end of the second resistor and a negative input terminal electrically connected to a second end of the second resistor. A third transistor has a gate electrically connected to an output terminal of the first operation amplifier. The third transistor is configured to conduct a first detection current corresponding to a first voltage drop across the first resistor according to the output of the first operational amplifier. A fourth transistor has a gate electrically connected to an output terminal of the second operation amplifier. The fourth transistor is configured to conduct a second detection current corresponding to a second voltage drop across the second resistor. A first current replication circuit has a first end electrically connected to a drain of the fourth transistor and a second end electrically connected to a drain of the third transistor. The first current replication circuit is configured to mirror the second detection current and cause the second detection current to be subtracted from the first detection current output at the drain of the third transistor. A third resistor is provided with a first end electrically connected to the ground reference voltage and a second end electrically connected to the drain of the third transistor. The third resistor conducts a current equal to that obtained by subtracting the second detection current from the first detection current.

Hereinafter, a semiconductor integrated circuit according to an example embodiment will be described with reference to drawings. The present disclosure is not limited to the example embodiments.

First Embodiment

Figure 1:
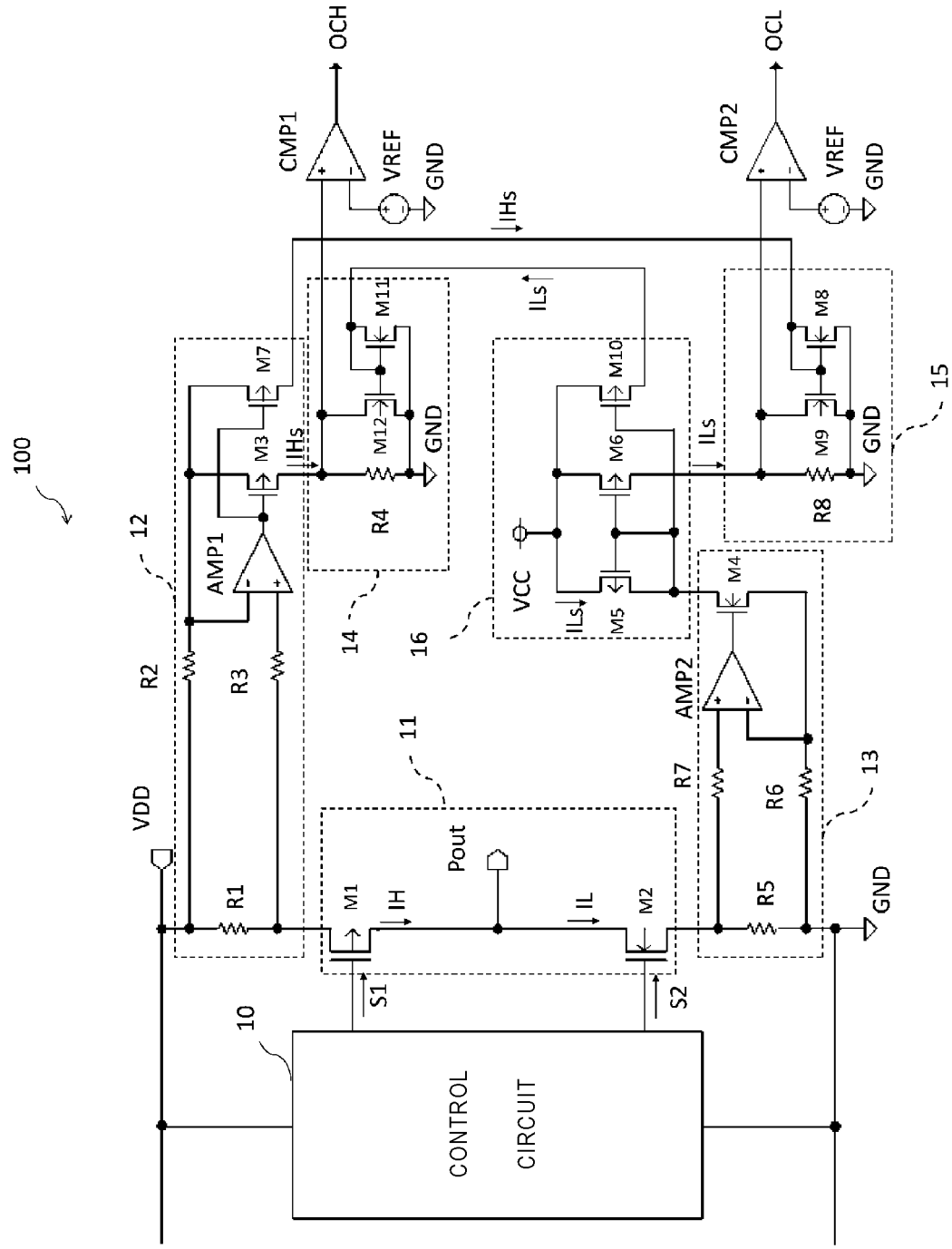
FIG. 1 is a circuit diagram schematically showing the configuration of an amplifier circuit of a first embodiment.

The configuration of an amplifier circuit according to the first embodiment will be described with reference to FIG. 1. FIG. 1 is a circuit diagram schematically showing the configuration of an amplifier circuit 100.

The amplifier circuit 100 includes a control circuit 10, a push-pull circuit 11, a first current detection circuit 12, a second current detection circuit 13, a first voltage conversion circuit 14, a second voltage conversion circuit 15, a current mirror circuit 16, a first comparator CMP1 and a second comparator CMP2.

The control circuit 10 controls operations of the push-pull circuit 11 by inputting signals S1 and S2. The control circuit 10 is, for example, a class AB control circuit that enables the push-pull circuit 11 to perform class AB operations, and/or may be a control circuit that enables the push-pull circuit 11 to perform class A operations, class B operations, or other operations.

The push-pull circuit 11 includes transistors M1, M2, and an output terminal Pout.

In this specification, for simplicity, the transistors are described and depicted as a metal-oxide-semiconductor field-effect transistor (MOSFET), but other field-effect transistors and junction-type transistors may be used.

The transistor M1 is a P-channel type transistor, and the transistor M2 is an N-channel type transistor. Drains of the transistors M1 and M2 are electrically connected to each other and the output terminal Pout. Gates of the transistors M1 and M2 are electrically connected to the control circuit 10, and a gate voltage and a current between a source and a drain of the transistors are controlled by respectively inputting different signals S1 and S2 thereto. Hereinafter, in the push-pull circuit 11, the power supply voltage VDD side (transistor M1 side) is described as the "Hiside", and the ground reference voltage GND side (transistor M2 side) is describes as the "Loside."

The first current detection circuit 12 includes resistances (resistors) R1, R2, R3, an amplifier AMP1, and P-channel type transistors M3 and M7. One end of the resistance R1 is electrically connected to a source of the transistor M1, and the other end is electrically connected to the power supply voltage VDD. One end of the resistance R2 is electrically connected to a node between the power supply voltage VDD and the resistance R1, and the other end is electrically connected to a negative input terminal of the amplifier AMP1 and sources of the transistors M3 and M7. One end of the resistance R3 is electrically connected to a node between the resistance R1 and the source of the transistor M1, and the other end is electrically connected to a positive input terminal of the amplifier AMP1. An output terminal of the amplifier AMP1 is electrically connected to gates of the transistors M3 and M7. The transistors M3 and M7 have same characteristics. The transistors M3 and M7 constitute a current replication (mirror) circuit, and currents with same magnitude flow between respective sources and drains.

The first current detection circuit 12 may also be configured such that the resistance R1 is electrically connected between the drain of the transistor M1 and the output terminal Pout, and the two input terminals of the amplifier AMP1 are respectively connected to nodes at opposite ends of the resistance R1 via the resistances R2 and R3.

The positive input terminal (+) of the first comparator CMP1 is electrically connected to the drain of the transistor M3. The negative input terminal (−) of the first comparator CMP1 is electrically connected to a reference voltage VREF.

The first voltage conversion circuit 14 includes a resistance R4 and N-channel type transistors M11 and M12. One end of the resistance R4 and a drain of the transistor M12 are electrically connected to a node between the drain of the transistor M3 and the positive input terminal of the first comparator CMP1. The other end of the resistance R4 and sources of the transistors M11 and M12 are electrically connected to a ground reference voltage GND. A gate and a drain of the transistor M11 and a gate of the transistor M12 are electrically connected to a drain of a transistor M10 described later. The transistors M11 and M12 have same electrical characteristics. The transistors M11 and M12 constitute a current replication (mirror) circuit, and currents with same magnitude are replicated between respective sources and drains.

The second current detection circuit 13 includes resistances R5, R6, R7, an amplifier AMP2, and an N-channel type transistor M4. One end of the resistance R5 is electrically connected to a source of the transistor M2, and the other end is electrically connected to the ground reference voltage GND. One end of the resistance R6 is electrically connected to a node between the ground reference voltage GND and the resistance R5, and the other end is electrically connected to a negative input terminal of the amplifier AMP2 and a source of the transistor M4. One end of the resistance R7 is electrically connected to a node between the resistance R5 and the source of the transistor M2, and the other end is electrically connected to a positive input terminal of the amplifier AMP2. An output terminal of the amplifier AMP2 is electrically connected to a gate of the transistor M4.

The second current detection circuit 13 may also be configured such that the resistance R5 is electrically connected between the drain of the transistor M2 and the output terminal Pout, and the two input terminals of the amplifier AMP2 are respectively connected to nodes at opposite ends of the resistance R5 via the resistances R6 and R7.

The current mirror circuit 16 includes P-channel type transistors M5, M6, and M10. A drain of the transistor M5 and gates of the transistors M5, M6, and M10 are electrically connected to a drain of the transistor M4. Sources of the transistors M5, M6, and M10 are electrically connected to a power supply voltage VCC. A drain of the transistor M6 is electrically connected to a positive input terminal of the second comparator CMP2. The transistors M5, M6, and M10 have same electrical characteristics. The transistors M5, M6, and M10 constitute a current replication circuit, and currents with same magnitude are replicated between respective sources and drains.

The positive input terminal of the second comparator CMP2 is electrically connected to the drain of the transistor M6. A negative input terminal of the second comparator CMP2 is electrically connected to the reference voltage VREF. The second voltage conversion circuit 15 includes a resistance R8 and N-channel type transistors M8 and M9.

One end of the resistance R8 and a drain of the transistor M9 are electrically connected to a node between the drain of the transistor M6 and the positive input terminal of the second comparator CMP2. The other end of the resistance R8 and sources of the transistors M8 and M9 are electrically connected to the ground reference voltage GND. A drain of the transistor M8 and gates of the transistors M8 and M9 are electrically connected to a drain of the transistor M7. The transistors M8 and M9 have same electrical characteristics. The transistors M8 and M9 constitute a current replication (mirror) circuit, and currents with same magnitude are replicated between respective sources and drains.

Functions of each part of the amplifier circuit 100 will be described.

The push-pull circuit 11 alternately uses the transistor M1 and the transistor M2 and outputs an output current Iout from the output terminal Pout. The transistor M1 and the transistor M2 operate in saturation in this context. Regardless of whether the transistor M1 or the transistor M2 is used by the push-pull circuit 11, a bias current Ib is always conducted between the sources and the drains of the transistor M1 and the transistor M2. A current of Iout+Ib flows between the source and drain of the transistor that is being used among the transistor M1 and the transistor M2.

When the push-pull circuit 11 performs class AB amplification, using the transistor M1 in this context means that the transistor M1 discharges the output current Iout from the output terminal Pout. Furthermore, using the transistor M2 in this context means that the transistor M2 draws the output current Iout from the output terminal Pout.

A Hiside current IH flowing through the transistor M1 is converted into a voltage appearing across t the resistance R1. The first current detection circuit 12 converts the voltage appearing across the resistance R1 into a Hiside detection current IHs (corresponding to the Hiside current IH) with the amplifier AMP1 and the transistor M3. The Hiside detection current IHs flows between the source and the drain of the transistor M3.

A Loside current IL flowing through the transistor M2 is converted into a voltage appearing across the resistance R5. The second current detection circuit 13 converts the voltage appearing across the resistance R5 into a Loside detection current ILs (corresponding to the Loside current IL) with the amplifier AMP2 and the transistor M4. The Loside detection current ILs flows between the source and the drain of the transistor M4.

The current mirror circuit 16 causes the equivalent of the Loside detection current ILs flowing through the transistors M4 and M5, to flow between the sources and drains of the transistors M6 and M10.

The first voltage conversion circuit 14 converts a current flowing through the resistance R4 into a Hiside detection voltage VHs. The Loside detection current ILs flows between the sources and the drains of the transistors M11 and M12. Since the resistance R4 and the source and drain of the transistor M12 are electrically connected in parallel, a current equal to a value obtained by subtracting the Loside detection current ILs from the Hiside detection current IHs flows through the resistance R4. That is, the resistance R4 converts a current of IHs−ILs into the Hiside detection voltage VHs.

The first comparator CMP1 compares the Hiside detection voltage VHs with the reference voltage VREF, and outputs an overcurrent detection signal OCH from the output terminal. When VHs≥VREF, that is, IHs−ILs is equal to or greater than a specified value, the first comparator CMP1 determines that a current exceeding the specified value is flowing through the output terminal Pout of the push-pull circuit 11, and outputs a high level overcurrent detection signal OCH. When VHs<VREF, that is, IHs−ILs is less than the specified value, the first comparator CMP1 determines that a current less than the specified value is flowing through the output terminal Pout of the push-pull circuit 11, and outputs a low level overcurrent detection signal OCH.

The second voltage conversion circuit 15 converts a current flowing through the resistance R8 into a Loside detection voltage VLs. The Hiside detection current IHs flows between the sources and the drains of the transistors M8 and M9. Since the resistance R8 and the source and drain of the transistor M9 are electrically connected in parallel, a current equal to a value obtained by subtracting the Hiside detection current IHs from the Loside detection current ILs flows through the resistance R8. That is, the resistance R8 converts the current of ILs−IHs into the Loside detection voltage VLs.

The second comparator CMP2 compares the Loside detection voltage VLs with the reference voltage VREF, and outputs an overcurrent detection signal OCL from the output terminal Pout. When VLs≥VREF, that is, ILs−IHs is equal to or greater than a specified value, the second comparator CMP2 determines that a current exceeding the specified value is flowing through the output terminal Pout of the push-pull circuit 11, and outputs a high level overcurrent detection signal OCL. When VLs<VREF, that is, ILs−IHs is less than the specified value, the second comparator CMP2 determines that a current less than the specified value is flowing through the output terminal Pout of the push-pull circuit 11, and outputs the low level overcurrent detection signal OCL.

An example of an amplifier circuit 100 having a current detection function with a small difference between the output current Iout and the detected current will be described.

In the following description, a value of the detection current corresponding to the output current Iout is represented as "Iouts," and a value of the detection current corresponding to the bias current Ib is represented as "Ibs." A value of the detection current corresponding to Iout+Ibis thus Iouts+Ibs.

First, a current detection function when the push-pull circuit 11 uses the transistor M1 in operation will be described.

When the push-pull circuit 11 uses the transistor M1, a Hiside current IH having a value obtained by combining the output current Iout and the bias current Ib flows through the transistor M1. The bias current Ib flows through the transistor M2. That is, IH=Iout+Ib and IL=Ib.

The first current detection circuit 12 detects the Hiside current IH and converts it into the Hiside detection current IHs, where IHs=Iouts+Ibs.

The second current detection circuit 13 detects the Loside current IL and converts it into the Loside detection current ILs, where ILs=Ibs.

The first voltage conversion circuit converts a current having a value equal to IHs−ILs into the Hiside detection voltage VHs. Since IHs−ILs=Iouts, a value of the output current Iout can thus be obtained based on a value of the Hiside detection voltage VHs.

The first comparator CMP1 compares the Hiside detection voltage VHs with the reference voltage VREF, and outputs the overcurrent detection signal OCH from its output terminal. Since IHs−ILs=Iouts, the value of the output current Iout can thus be obtained based on the value of the Hiside detection voltage VHs. That is, when the Hiside detection voltage VHs is compared with an appropriately set reference voltage VREF, it can be determined whether the output current Iout is equal to or greater than the specified value.

Next, a current detection function when the push-pull circuit 11 uses the transistor M2 in operation will be described.

When the push-pull circuit 11 uses the transistor M2, a Loside current IL equal to a value obtained by combining the output current Iout and the bias current Ib flows through the transistor M2. The bias current Ib flows through the transistor M1. That is, IL=Iout+Ib and IH=Ib.

The second current detection circuit 13 detects the Loside current IL and converts it into the Loside detection current ILs, where ILs=Iouts+Ibs. The current mirror circuit 16 reflects the Loside detection current ILs.

The first current detection circuit 12 detects the Hiside current IH and converts it into the Hiside detection current Ihs, where IHs=Ibs.

The second voltage conversion circuit converts a current equal to a value of ILs−IHs into the Loside detection voltage VLs. Since ILs−IHs=Iouts, a value of the output current Iout can thus be obtained based on a value of the Loside detection voltage VLs.

The second comparator CMP2 compares the Loside detection voltage VLs with the reference voltage VREF, and outputs the overcurrent detection signal OCL from the output terminal. Since ILs−IHs=Iouts, the output current Iout can be obtained based on a value of the Loside detection voltage VLs. That is, when the Loside detection voltage VLs is compared with the appropriately set reference voltage VREF, it can be determined whether the output current Iout is equal to or greater than the specified value.

Figure 2:
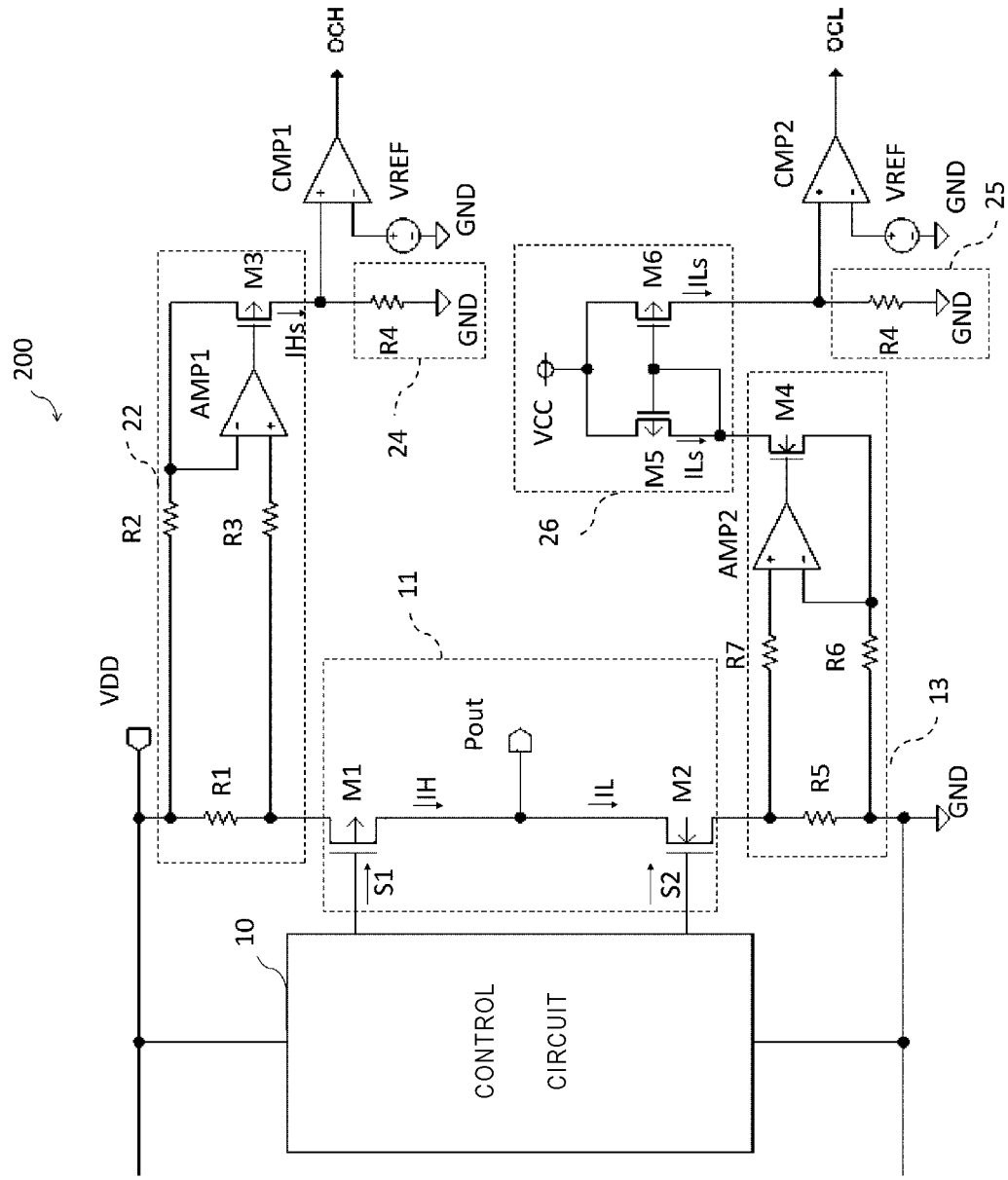
FIG. 2 is a circuit diagram schematically showing the configuration of an amplifier circuit of a comparative embodiment.

The configuration of an amplifier circuit 200 according to a comparative embodiment will be described with reference to FIG. 2. FIG. 2 is a circuit diagram schematically showing the configuration of the amplifier circuit 200 according to the comparative embodiment.

The amplifier circuit 200 is different from the amplifier circuit 100 in that transistor M7 is not in the first current detection circuit 22, transistors M11 and M12 are not in the first voltage conversion circuit 24, transistors M8 and M9 are not provided in the second voltage conversion circuit 25, and transistor M10 is not provided in the current mirror circuit 26.

A current detection function of the amplifier circuit 200 according to the comparative embodiment will be described.

When the push-pull circuit 11 uses the transistor M1 in operation, the first current detection circuit 22 detects a Hiside current IH and converts it into a Hiside detection current IHs. The resistance R4 converts the Hiside detection current IHs into a Hiside detection voltage VHs. The first comparator CMP1 compares the Hiside detection voltage VHs with the reference voltage VREF, and outputs an overcurrent detection signal OCH from the output terminal.

At this time, IH=Iout+Ib and IHs=Iouts+Ibs. The value of the output current calculated based on the Hiside detection voltage VHs is Iout+Ib. Thus, the first comparator CMP1 determines whether the output current Iout is equal to or greater than the specified value based on a value in which the error corresponding to the bias current Ib is superimposed on the actual output current Iout.

When the push-pull circuit 11 uses the transistor M2 to operate, the second current detection circuit 13 detects the Loside current IL and converts it into the Loside detection current ILs. The current mirror circuit 26 reflects the Loside detection current ILs. The resistance R5 converts the Loside detection current ILs into the Loside detection voltage VLs.

The second comparator CMP2 compares the Loside detection voltage VLs with the reference voltage VREF, and outputs the overcurrent detection signal from the output terminal.

At this time, IL=Iout+Ib. The value of the output current calculated based on the Loside detection current ILs and the Loside detection voltage VLs is Iout+Ib. Thus, the second comparator CMP2 determines whether the output current Iout is equal to or greater than the specified value based on a value in which the error corresponding to the bias current Ib is superimposed on the actual output current Iout.

As described, in the comparative embodiment, a current flowing into one of the transistors M1 or M2 of the push-pull circuit 11 is detected and converted into a detection voltage. An error, corresponding to the bias current Ib that continuously flows in the push-pull amplifier, occurs between the value of the detection current (Iouts+Ibs) and the value of the output current (Iout). Furthermore, an error also occurs in the detection voltage as converted based on the detection current, and an error also occurs in overcurrent detection performed by any comparator using the detection voltage.

However, in the amplifier circuit 100 according to the first embodiment, the value of the other detection current is subtracted from the one of the detection currents of Hiside or Loside corresponding to the output current Iout. The subtracted detection current corresponds to the detection current of the output current Iout. That is, error due to the bias current Ib does not occur between the value of the subtracted detection current (Iouts) and the value of the actual output current (Iout). Therefore, the error due to the bias current Ib does not occur in the overcurrent detection using a detection voltage obtained by converting the subtracted detection current.

As described above, according to the first embodiment, the amplifier circuit 100 having a current detection function providing only a small error between the output current and the detection current corresponding to the output current can be provided.

As explained above, in an amplifier circuit according to the first embodiment, the value of the other side detection current is subtracted from other one of the detection currents of Hiside and Loside that corresponds to the output current Iout. The error due to the bias current Ib is thus substantially eliminated between the value of the subtracted detection current (Iouts) and the value of the actual output current (Iout). Therefore, an error due to the bias current Ib does not occur in overcurrent detection using the detection voltage obtained by converting the subtracted detection current. As described above, according to the first embodiment, the amplifier circuit 100 having a current detection function with low error between the output current and the detection current corresponding to the output current can be provided.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An amplifier circuit, comprising:
    an output terminal;
    a first transistor and a first resistor that are electrically connected in series between a power supply terminal and the output terminal;
    a second transistor and a second resistor that are electrically connected in series between the output terminal and a ground reference voltage, the second transistor and the first transistor being different channel types;
    a first operational amplifier having a positive input terminal electrically connected to a first end of the first resistor and a negative input terminal electrically connected to a second end of the first resistor;
    a second operational amplifier having a positive input terminal electrically connected to a first end of the second resistor and a negative input terminal electrically connected to a second end of the second resistor;
    a third transistor having a gate electrically connected to an output terminal of the first operation amplifier, the third transistor configured to conduct a first detection current corresponding to a first voltage drop across the first resistor according to the output of the first operational amplifier;
    a fourth transistor having a gate electrically connected to an output terminal of the second operation amplifier, the fourth transistor configured to conduct a second detection current corresponding to a second voltage drop across the second resistor;
    a first current replication circuit having a first end electrically connected to a drain of the fourth transistor and a second end electrically connected to a drain of the third transistor, the first current replication circuit configured to mirror the second detection current and to cause the second detection current to be subtracted from the first detection current output at the drain of the third transistor; and
    a third resistor with a first end electrically connected to the ground reference voltage and a second end electrically connected to the drain of the third transistor, the third resistor conducting a current obtained by subtracting the second detection current from the first detection current.

2. The amplifier circuit according to claim 1, further comprising:
    a fifth transistor configured to conduct a mirrored second detection current between a source and a drain;
    a second current replication circuit with a first end electrically connected to a source of the third transistor and a second end electrically connected to the drain of the fifth transistor, the second current replication circuit configured to mirror the first detection current and to cause the first detection current to be subtracted from the second detection current; and
    a fourth resistor with a first end electrically connected to the ground reference voltage and a second end electrically connected to the drain of the fifth transistor, the fourth resistor conducting a current obtained by subtracting the first detection current from the second detection current.

3. The amplifier circuit according to claim 2, wherein the first current replication circuit includes:
    a sixth transistor with a drain and a gate electrically connected to each other and a source connected to the first end of the third resistor, and
    a seventh transistor having a drain electrically connected to the second end of the third resistor, a source electrically connected to the first end of the third resistor, and a gate electrically connected to the gate of the sixth transistor, and the second current replication circuit includes:
an eighth transistor having a drain and a gate electrically connected to each other and a source connected to the first end of the fourth resistor, and
a ninth transistor having a drain electrically connected to the second end of the fourth resistor, a source electrically connected to the first end of the fourth resistor, and a gate electrically connected to the gate of the eighth transistor.

4. The amplifier circuit according to claim 2, wherein
the first current replication circuit comprises a current mirror circuit, and
the second current replication circuit comprises a current mirror circuit.

5. The amplifier circuit according to claim 2, further comprising:
a first comparator with one input terminal electrically connected between the third transistor and the third resistor; and
a second comparator with one input terminal electrically connected between the fifth transistor and the fourth resistor.

6. The amplifier circuit according to claim 5, wherein the first comparator and the second comparator each have a second input terminal receiving a reference voltage.

7. The amplifier circuit according to claim 1, further comprising:
a control circuit connected to gates of the first and second transistors.

8. The amplifier circuit according to claim 7, wherein the control circuit is a class AB control circuit.

9. The amplifier circuit according to claim 1, wherein the first and second transistors are metal-oxide-semiconductor field effect transistors.

10. The amplifier circuit according to claim 1, wherein the first transistor is a P-channel type transistor and the second transistor is a N-channel type transistor.

11. The amplifier circuit according to claim 1, further comprising:
a resistor between the positive input terminal of the first operational amplifier and the first end of the first resistor.

12. An amplifier circuit, comprising:
a push-pull circuit including a first transistor and a second transistor of different channel types connected in series between a power supply voltage and a ground reference voltage, an output terminal being connected to a node between the first and second transistors;
a first current detection circuit electrically connected between the power supply voltage and the first transistor, and configured to detect a source-drain current of the first transistor and supply a first detection current corresponding to the source-drain current of the first transistor;
a second current detection circuit electrically connected between the second transistor and the ground reference voltage, and configured to detect a source-drain current of the second transistor and supply a second detection current corresponding to the source-drain current of the second transistor;
a first current replication circuit configured to replicate the second detection current supplied by the second current detection circuit and to subtract the second detection current from the first detection current;
a first resistor connected to the first current detection circuit and the first current replication circuit so as to conduct a current equal to that obtained by subtracting the second detection current from the first detection current;
a second current replication circuit configured to replicate the first detection current supplied from the first current detection circuit and to subtract the first detection current from the second detection current; and
a second resistor connected to the second current detection circuit and the second current replication circuit so as to conduct a current equal to that obtained by subtracting the first detection current from the second detection current.

13. The amplifier circuit according to claim 12, wherein
the first current replication circuit comprises a current mirror circuit, and
the second current replication circuit comprises a current mirror circuit.

14. The amplifier circuit according to claim 12, further comprising:
a first comparator with one input terminal electrically connected between the first resistor and the first current detection circuit; and
a second comparator with one input terminal electrically connected between the second resistor and the second current detection circuit.

15. The amplifier circuit according to claim 12, further comprising:
a third resistor between the power supply voltage and the push-pull circuit; and
a fourth resistor between the ground reference voltage and the push-pull circuit, wherein
the first current detection circuit detects the source-drain current of the first transistor as a voltage drop across the third resistor, and
the second current detection circuit detects the source-drain current of the second transistor as a voltage drop across the fourth resistor.

16. The amplifier circuit according to claim 12, further comprising:
a control circuit connected to gates of the first and second transistors.

17. An amplifier circuit, comprising:
a push-pull circuit including a first transistor and a second transistor of different channel types connected in series between a power supply voltage and a ground reference voltage, an output terminal being connected to a node between the first and second transistors;
a first resistor between the power supply voltage and the first transistor;
a second resistor between the ground reference voltage and the second transistor;
a first detection circuit configured to detect a voltage drop across the first resistor to detect a source-drain current of the first transistor, the first detection circuit supplying a first detection current corresponding to the source-drain current of the first transistor;
a second current detection configured to detect a voltage drop across the second resistor to detect a source-drain current of the second transistor, the second detection circuit supplying a second detection current corresponding to the source-drain current of the second transistor;
a first replication circuit configured to mirror the second detection current supplied by the second detection circuit and to subtract the mirrored second detection current from the first detection current;

a third resistor connected to the first current detection circuit and the first current replication circuit so as to conduct a current equal to that obtained by subtracting the mirrored second detection current from the first detection current;

a second replication circuit configured to mirror the first detection current supplied from the first detection circuit and to subtract the mirrored first detection current from the second detection current; and a fourth resistor connected to the second current detection circuit and the second replication circuit so as to conduct a current equal to that obtained by subtracting the mirrored first detection current from the second detection current.

18. The amplifier circuit according to claim 17, further comprising:

a control circuit connected to gates of the first and second transistors.

19. The amplifier circuit according to claim 17, further comprising:

a first comparator with one input terminal electrically connected between the third resistor and the first detection circuit; and a second comparator with one input terminal electrically connected between the fourth resistor and the second detection circuit.

20. The amplifier circuit according to claim 19, wherein each of the first comparator and the second comparator has a second input terminal receiving a reference voltage.

\* \* \* \* \*

UNITED STATES PATENT AND TRADEMARK OFFICE
CERTIFICATE OF CORRECTION

PATENT NO. : 11,050,390 B2
APPLICATION NO. : 16/800762
DATED : June 29, 2021
INVENTOR(S) : Takaya Yasuda and Kazuyasu Minami It is certified that error appears in the above-identified patent and that said Letters Patent is hereby corrected as shown below:

On the Title Page

Item (73) the Assignee "KABUSHI KAISHA TOSHIBA" should be replaced with "KABUSHIKI KAISHA TOSHIBA".

Signed and Sealed this
Thirty-first Day of May, 2022

Katherine Kelly Vidal
*Director of the United States Patent and Trademark Office*